United States Patent [19]

Mahabadi

[11] Patent Number: 4,769,559

[45] Date of Patent: Sep. 6, 1988

[54] SWITCHABLE CURRENT SOURCE

[75] Inventor: John K. Mahabadi, Tempe, Ariz.

[73] Assignee: Motorola, Inc., Schaumburg, Ill.

[21] Appl. No.: 56,912

[22] Filed: Jun. 2, 1987

[51] Int. Cl.⁴ .......................... H03K 3/01; G05F 3/16
[52] U.S. Cl. .................. 307/296 R; 307/270;
 307/585; 323/315
[58] Field of Search .................. 307/296.1, 296.8, 270,
 307/571, 574, 575, 577, 583, 584, 585, 240;
 323/315, 316, 325

[56] References Cited

U.S. PATENT DOCUMENTS 4,645,948 2/1987 Morris et al. ................ 323/315
4,694,201 9/1987 Jason ................... 323/315

Primary Examiner—Stanley D. Miller
Assistant Examiner—Trong Quang Phan
Attorney, Agent, or Firm—William E. Koch

[57] ABSTRACT

A switchable current source is provided for providing a relatively high frequency pulsed current to a load. The current source comprises six MOS transistors responsive to an enable signal and an input comprising a pulsating digital signal provide a pulsating digital output signal substantially similar to the input signal.

5 Claims, 1 Drawing Sheet

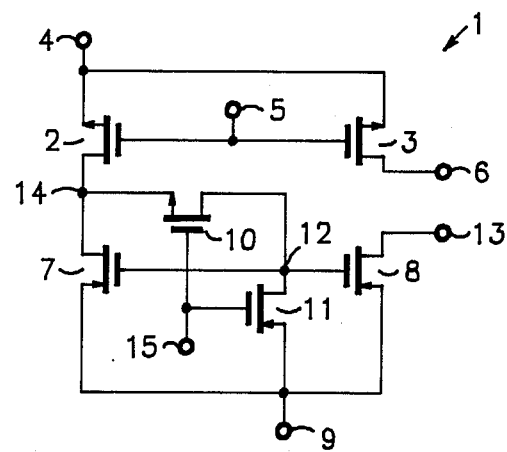

SWITCHABLE CURRENT SOURCE

FIELD OF THE INVENTION

This invention relates in general to a current source circuit and, more specifically, to a switchable current source circuit for providing a relatively high frequency pulsed current to a load.

BACKGROUND OF THE INVENTION

The prior art is replete with different types of current source circuits for providing an output current that is a function of some parameter (transistor scaling, resistance, temperature, etc.) of the circuit. For instance, a basic current source that is well known in the art is the simple current mirror circuit comprising a diode-connected transistor having its emitter and base coupled in parallel with the emitter and base of a second transistor. The commonly connected emitters of each transistor are connected to a source of operating potential with the collector of the diode-connected transistor being coupled to a source of input current. The input current is mirrored through the second transistor wherein the current flowing in the collector thereof is equal in magnitude to the value of the input current. Moreover, as is understood, the value of the collector current flowing in the second transistor can be made any ratio of the input current by area ratioing the emitter areas of the two transistors. The disadvantage of this circuit is that errors are inherent therein which prevents the absolute matching of the output current to the input current. The most significant cause of this error is the base current error associated with the two transistors, especially if these devices are PNP transistors. Additionally, this circuit is subject to errors induced by power supply ripple variations due to finite output impedance.

Other bipolar prior art current sources reduce the errors associated with the PNP base current flow but suffer in that higher voltage drops across the current source are required in order to provide a current at the output.

A known bipolar switchable precision current source, U.S. Pat. No. 4,423,357, comprises a first transistor coupled between a power supply and a load. Two other complementary transistors have their emitters coupled together and their collectors coupled between the base and collector of the first transistor. One of the two complementary transistors has its base coupled to a switching signal source for switching the current on and off and the other has its base coupled to a reference voltage for regulating the current through the first transistor.

Many MOS transistor constant current sources also exist in the prior art. Typically, first and second transistors are coupled in series and are coupled in parallel with third and fourth transistors that are coupled in series. One of the transistors in at least one of the series connected transistors is coupled as a diode. An output transistor has a gate coupled to a node between one of the series coupled pair. However, these do not provide the pulsating output from a switchable input.

Thus, what is needed is a low voltage, switchable MOS transistor current source.

SUMMARY OF THE INVENTION

Accordingly, it is an object of the present invention to provide an improved switchable current source.

Another object of the present invention is to provide a MOS transistor switchable current source.

Yet another object of the present invention is to provide a MOS transistor switchable current source that may be pulsed at high frequency.

In carrying out the above and other objects of the invention in one form, a first MOS transistor is provided with a gate coupled to an enable terminal and a source-drain current path coupled between a first voltage terminal and a first node. A second MOS transistor has a gate coupled to the enable terminal and a source-drain current path coupled between the first voltage terminal and a first output terminal. A third MOS transistor has a gate coupled to a second node and a source-drain current path coupled between the first node and a second voltage terminal. A fourth MOS transistor has a gate coupled to the second node and a source-drain current path coupled between a second output terminal and the second voltage terminal. A fifth MOS transistor has a gate coupled to an input terminal and a source-drain current path coupled between the first and second nodes. A sixth MOS transistor has a gate coupled to the input terminal and a source-drain current path coupled between the second node and the second voltage terminal.

The above and other objects, features, and advantages of the present invention will be better understood from the following detailed description taken in conjunction with the accompanying drawings.

BRIEF DESCRIPTION OF THE DRAWING

The single figure is a schematic of the preferred embodiment of the present invention.

DETAILED DESCRIPTION OF THE INVENTION

Referring to the single figure, a switchable current source circuit 1 is shown which is suitable to be fabricated in monolithic integrated circuit form as well as with discrete components. Current source circuit 1 comprises P-channel MOS transistors 2 and 3 having their sources connected to supply voltage terminal 4 and their gates connected to digital enable terminal 5. The switchable current source circuit 1 will be disabled when the digital signal on terminal 5 and 15 are both high. The switchable current source circuit 1 will be enabled when the digital signal on terminal 5 and 15 are both low. The drain of transistor 3 is connected to output terminal 6. N-channel transistors 7 and 8 have their sources connected to voltage terminal 9 and their gates connected to node 12. The drain of transistor 8 is connected to output terminal 13. The drains of transistors 2 and 7 are connected to node 14. Transistor 10 has its source and drains connected to nodes 14 and 12, respectively, and its gate connected to segment enable terminal 15. A segment signal appearing on terminal 15 is a pulsating signal representing an "on" signal, indicating when the current is to be supplied. Transistor 11 has its drains connected to node 12, its source connected to voltage terminal 9 and its gate connected to terminal 15.

Although the transistors shown in current source circuit 1 have been described as specifically N-channel or P-channel, it should be understood that slight changes would allow for the use of either N-channel or P-channel transistors.

Current source circuit 1 is enabled by applying a digital low signal to terminal 5, thereby turning on transistors 2 and 3. When a low segment enable signal is applied to terminal 15, transistor 10 is turned on, thereby turning on transistors 7 and 8. Transistor 11 is off. Transistors 2 and 10 are saturated, causing nodes 14 and 12 both to be substantially at the voltage on terminal 4. Transistor 8 therefore sinks current through a load coupled across output terminals 6 and 13. The current mirror may be manufactured so that transistor 8 is scaled at some multiple of transistor 7 in order to provide a current determined by the formula as follows:

$$I_8 = I_7 (W/L)_8 / (W/L)_7,$$

where
$I_8$ = current through transistor 8,
$I_7$ = current through transistor 7,
W = channel width of a MOS transistor,
L = channel length of a MOS transistor,
$(W/L)8$ = width/length of transistor 8, and
$(W/L)7$ = width/length of transistor 7,
Transistor 8 also is scaled to pull approximately a tenth of the current available from transistor 3.

When segment enable signal on terminal 15 and digit enable on terminal 5 both go low, transistor 11 is turned off and transistor 10 is on pulling up the gate of transistors 7 and 8, thereby providing current between output terminals 6 and 13.

Current source circuit 1 may be used for any one of many applications. One specific application includes driving an LED when the signal on terminal 5 is low. A high frequency, approximately 10 khz., is applied to terminal 15. This provides a pulsating current output for driving the LED load at a speed at which would appear as a steady light to the human eye. Each one of a plurality of these circuits could drive an LED in an array of LEDs, wherein each LED would be provided with a standard, accurate current, resulting in the same level of brightness for each LED. The only fluctuation in the output current would be caused by fluctuations in the voltage on terminal 4; however, this would result in equal fluctuations in each output current and equal change in brightness for each LED.

By now it should be appreciated that a switchable current source has been provided.

I claim:

1. A circuit comprising:
   first means coupled to a first voltage for selectively supplying first and second currents;
   second means coupled between said first means and a second voltage for sinking said first and second currents, said second current passing through a load coupled between said first and second means; and
   third means coupled between a node between said first and second means and said second voltage and coupled to said second means for biasing said second means in response to an input signal, wherein said input signal comprises a digital signal having repeated pulses of a selected frequency and said output signal substantially has said selected frequency.

2. The circuit according to claim 1 wherein said first means comprises:
   a first MOS transistor having a gate coupled to an enable signal and a source-drain current path coupled between said first voltage and a first node; and
   a second MOS transistor having a gate coupled to said enable signal and a source-drain current path coupled between said first voltage and a first output terminal.

3. The circuit according to claim 2 wherein said second means comprises:
   a third MOS transistor having a gate coupled to a second node and a source-drain current path coupled between said first node and said second voltage; and
   a fourth MOS transistor having a gate coupled to said second node and a source-drain current path coupled between said second voltage and a second output terminal.

4. The circuit according to claim 3 wherein said third means comprises:
   a fifth MOS transistor having a gate coupled to said input signal and a source-drain current path coupled between said first node and said second node; and
   a sixth MOS transistor having a gate coupled to said input signal and a source-drain current path coupled between said second voltage and said second node.

5. A switchable current source comprising:
   a first voltage terminal;
   a second voltage terminal;
   an enable terminal;
   an input terminal;
   a first output terminal;
   a second output terminal;
   a first MOS transistor having a gate coupled to said enable terminal and a source-drain current path coupled between said first voltage terminal and a first node;
   a second MOS transistor having a gate coupled to said enable terminal and a source-drain current path coupled between said first voltage terminal and said first output terminal;
   a third MOS transistor having a gate coupled to a second node and a source-drain current path coupled between said second voltage terminal and said first node;
   a fourth MOS transistor having a gate coupled to said second node and a source-drain current path coupled between said second output terminal and said second voltage terminal;
   a fifth MOS transistor having a gate coupled to said input terminal and a source-drain current path coupled between said first node and said second node; and
   a sixth MOS transistor having a gate coupled to said input terminal and a source-drain current path coupled between said second voltage terminal and said second node.

* * * * *